(12) United States Patent
Shinada et al.

(10) Patent No.: US 11,939,665 B2
(45) Date of Patent: Mar. 26, 2024

(54) FILM THICKNESS MEASURING APPARATUS AND FILM THICKNESS MEASURING METHOD, AND FILM FORMING SYSTEM AND FILM FORMING METHOD

(71) Applicant: Tokyo Electron Limited, Tokyo (JP)

(72) Inventors: Masato Shinada, Tokyo (JP); Tamaki Takeyama, Yamanashi (JP); Kazunaga Ono, Yamanashi (JP); Naoyuki Suzuki, Tokyo (JP); Hiroaki Chihaya, Yamanashi (JP); Einstein Noel Abarra, Tokyo (JP)

(73) Assignee: TOKYO ELECTRON LIMTED, Tokyo (JP)

( * ) Notice: Subject to any disclaimer, the term of this patent is extended or adjusted under 35 U.S.C. 154(b) by 370 days.

(21) Appl. No.: 17/184,089

(22) Filed: Feb. 24, 2021

(65) Prior Publication Data
US 2021/0285096 A1  Sep. 16, 2021

(30) Foreign Application Priority Data

Mar. 10, 2020 (JP) ................................ 2020-040854
Nov. 4, 2020 (JP) ................................. 2020-184211

(51) Int. Cl.
  *C23C 14/54* (2006.01)
  *G01B 11/06* (2006.01)
  (Continued)

(52) U.S. Cl.
  CPC ........ *C23C 14/547* (2013.01); *G01B 11/0625* (2013.01); *G01S 7/4814* (2013.01);
  (Continued)

(58) Field of Classification Search
  CPC ..... C23C 14/547; C23C 14/54; C23C 14/568; C23C 14/505; C23C 16/52; C23C 14/50;
  (Continued)

(56) References Cited

U.S. PATENT DOCUMENTS

2002/0033945 A1* 3/2002 Xu .................... G01N 21/95607
                                                    356/369
2006/0144335 A1* 7/2006 Lee ......................... C23C 16/52
                                                    156/345.24
(Continued)

FOREIGN PATENT DOCUMENTS

JP      H105-149720 A    6/1993
JP      H11-330185 A    11/1999
(Continued)

*Primary Examiner* — Jaehwan Oh

(74) *Attorney, Agent, or Firm* — Venjuris, P.C.

(57) ABSTRACT

A film thickness measurement apparatus includes: a stage that places a substrate having a film formed thereon and measures a thickness of the film in-situ in a film forming apparatus; a film thickness meter including a light emitter that emits light toward the substrate disposed on the stage and a light receiving sensor that receives the light reflected by the substrate for measuring the thickness of the film in-situ; a moving mechanism including a multi-joint arm that moves an irradiation point of the light on the substrate; a distance meter that measures a distance between the light receiving sensor and the irradiation point on the substrate;

(Continued)

and a distance adjustor that adjusts the distance between the light receiving sensor and the irradiation point on the substrate.

28 Claims, 13 Drawing Sheets

(51) Int. Cl.
  *G01S 7/481* (2006.01)
  *G01S 17/08* (2006.01)
  *H01F 41/32* (2006.01)
  *H01L 21/66* (2006.01)
  *H10N 50/01* (2023.01)

(52) U.S. Cl.
  CPC .............. *G01S 17/08* (2013.01); *H01F 41/32* (2013.01); *H01L 22/12* (2013.01); *H10N 50/01* (2023.02)

(58) Field of Classification Search
  CPC ......... H01L 21/67253; H01L 21/67173; H01L 21/67184; H01L 21/6719; H01L 21/67196; H01L 22/12
  See application file for complete search history.

(56) References Cited

U.S. PATENT DOCUMENTS

| | | | |
|---|---|---|---|
| 2007/0100580 A1* | 5/2007 | Marcus | H01L 22/12 702/170 |
| 2011/0279822 A1* | 11/2011 | Kannaka | G01B 9/02003 356/503 |
| 2013/0243154 A1* | 9/2013 | Ishibashi | G01N 23/20 378/54 |
| 2015/0314314 A1* | 11/2015 | Kuwahara | B05C 13/00 118/668 |
| 2016/0181134 A1* | 6/2016 | Budiarto | H01L 21/0332 118/712 |
| 2016/0223712 A1* | 8/2016 | Price | C23C 14/505 |
| 2017/0355060 A1* | 12/2017 | Park | H01L 22/12 |
| 2018/0087142 A1* | 3/2018 | Pistner | H01J 37/32119 |
| 2018/0166346 A1* | 6/2018 | Tanaka | H01L 21/02019 |
| 2019/0360923 A1* | 11/2019 | Atanasoff | C23C 14/547 |
| 2020/0083080 A1* | 3/2020 | Clark | H01L 21/67161 |
| 2020/0395210 A1* | 12/2020 | Kwon | H01L 21/67242 |

FOREIGN PATENT DOCUMENTS

| | | |
|---|---|---|
| JP | 6160614 B2 | 7/2017 |
| JP | 6363382 B | 7/2018 |
| JP | 2018-119907 A | 8/2018 |
| KR | 10-1425493 B | 8/2014 |

* cited by examiner

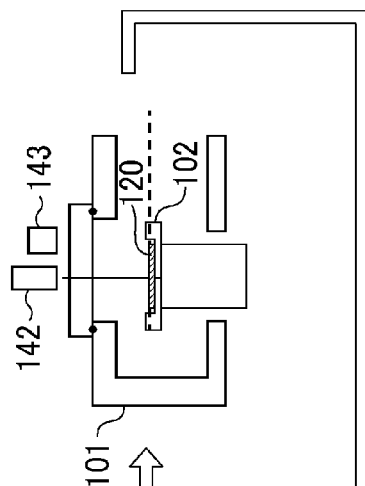
*FIG. 3A*  *FIG. 3B*  *FIG. 3C*
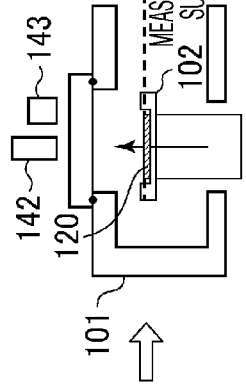
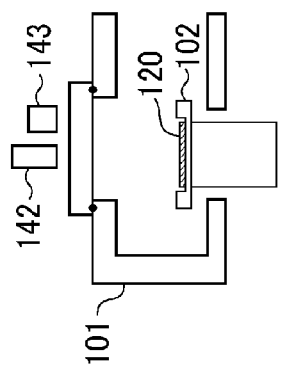
*FIG. 3D*  *FIG. 3E*  *FIG. 3F*
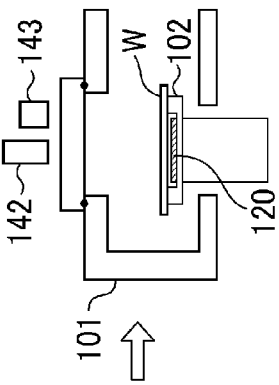
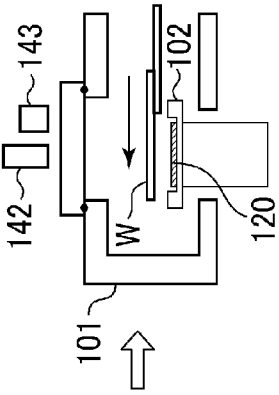
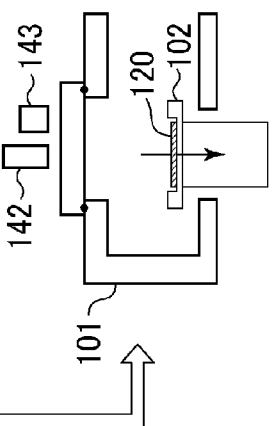

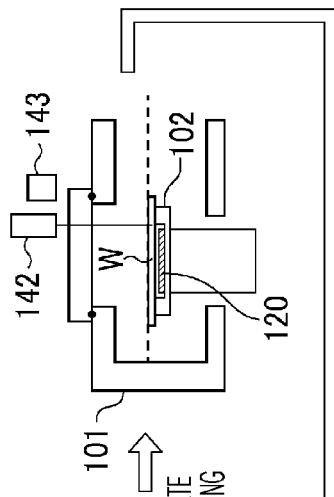
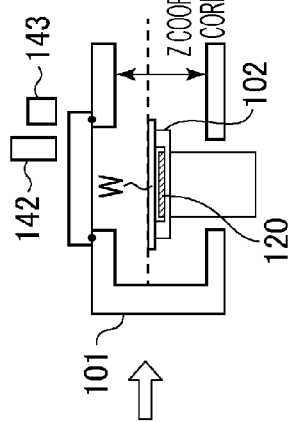
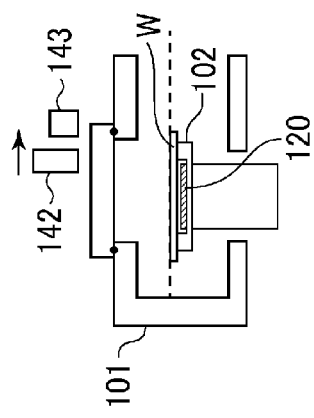
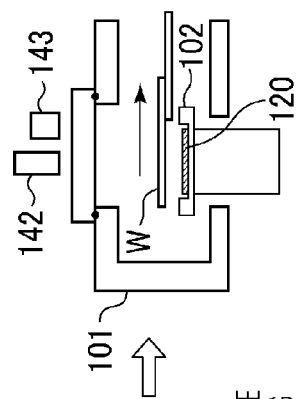
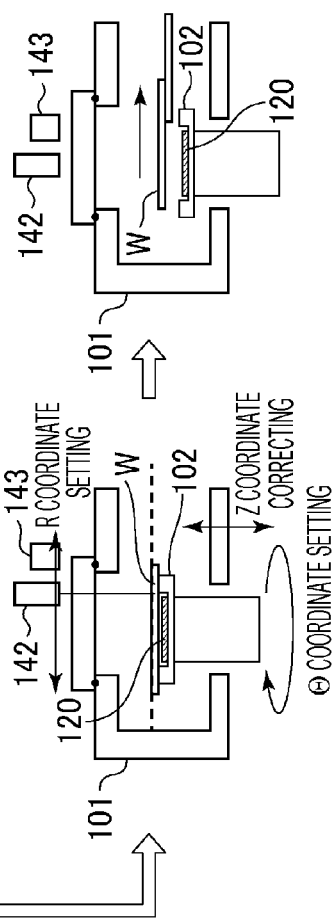

TEST PAD

FILM THICKNESS MEASURING APPARATUS AND FILM THICKNESS MEASURING METHOD, AND FILM FORMING SYSTEM AND FILM FORMING METHOD

CROSS-REFERENCE TO RELATED APPLICATIONS

This application is based on and claims priority from Japanese Patent Application Nos. 2020-040854 and 2020-184211, filed on Mar. 10, 2020 and Nov. 4, 2020, with the Japan Patent Office, the disclosures of which are incorporated herein in their entireties by reference.

TECHNICAL FIELD

The present disclosure relates to a film thickness measuring apparatus and a film thickness measuring method, and a film forming system and a film forming method.

BACKGROUND

Devices such as a magneto-resistive random access memory (MRAM) are manufactured by stacking a plurality of thin films. As a system for forming such a stacked film, a system in which a plurality of processing modules is connected to a vacuum transfer chamber to sequentially form each of the films is known (e.g., Japanese Patent No. 6160614).

Meanwhile, it is required to confirm whether the formed film has a desired film thickness or not, and thus, a technology that measures a formed film in-situ is disclosed in Japanese Patent Laid-Open Publications Nos. 05-149720 and 11-330185.

SUMMARY

A film thickness measuring apparatus according to an aspect of the present disclosure is configured to measure a film thickness of a film formed on a substrate in-situ in a film forming system including a processing module that forms a film on a substrate and a transfer module that transfers the substrate to the processing module. The film thickness measuring apparatus includes: a stage configured to place the substrate having the film formed thereon; a measurement light emitting/detecting unit including a light emitting unit that emits film thickness measurement light toward the substrate on the stage and a light receiving sensor that receives reflected light reflected by the substrate; a moving mechanism configured to move an irradiation point of the light on the substrate; a distance meter configured to measure a distance between the light receiving sensor and the irradiation point on the substrate; and a distance adjusting mechanism configured to adjust the distance between the light receiving sensor and the irradiation point on the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 3A to 3F are views illustrating a procedure of a previous step of measuring a film thickness of a film formed on a substrate.

FIGS. 5A to 5E are views illustrating a procedure for actually measuring a film thickness at a film thickness measurement position where a distance in the Z direction is measured.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of the present disclosure will be described in detail with reference to the drawings.

[Film Forming System]

Figure 1:
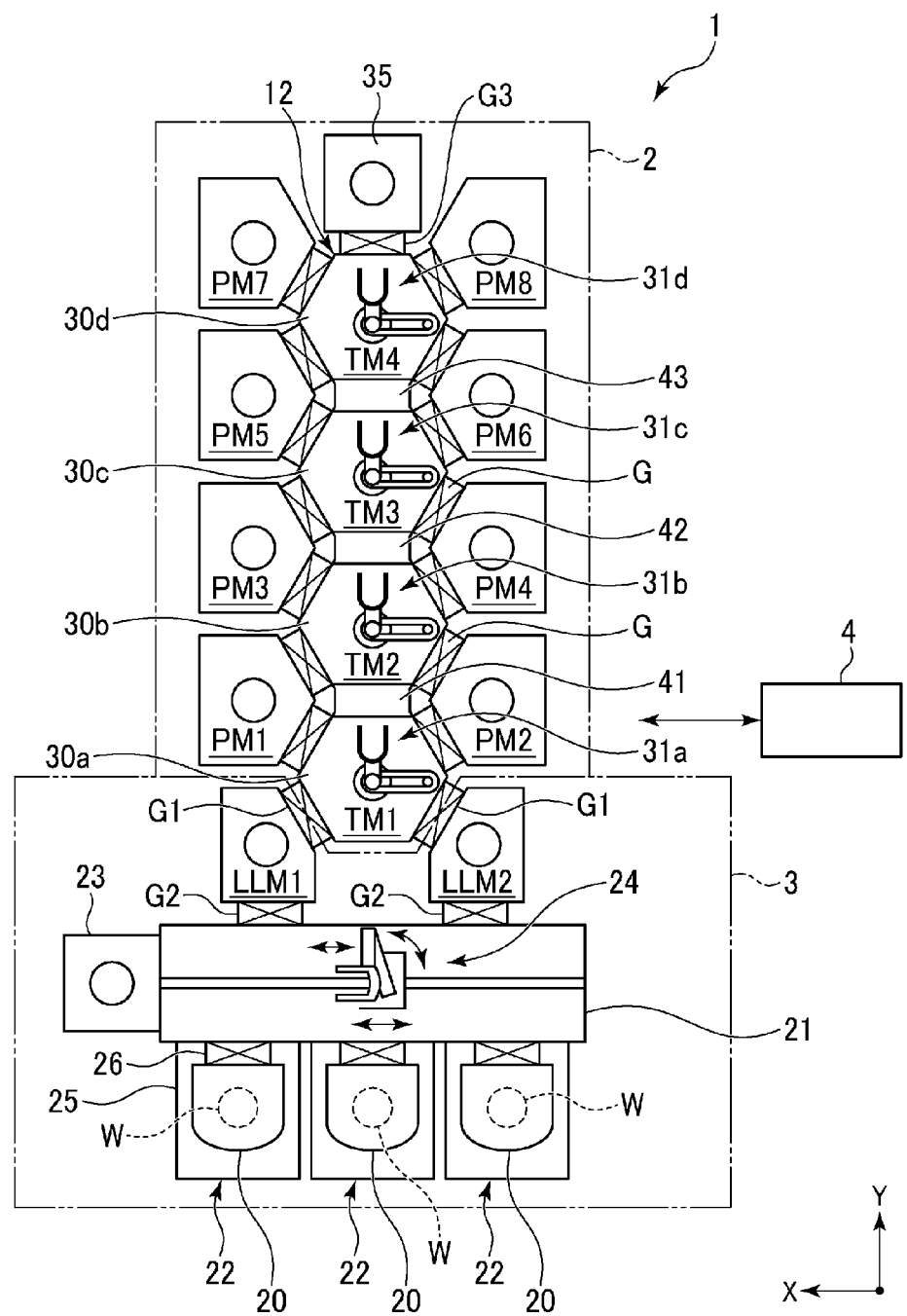
FIG. 1 is a plan view schematically illustrating a film forming system provided with a film thickness measuring apparatus.

FIG. 1 is a plan view schematically illustrating a film forming system provided with a film thickness measuring apparatus.

A film forming system 1 includes a processing section 2 in which a plurality of processings including film formation of a magnetic film is performed, a carry-in/out section 3 in which a plurality of substrates is held and a substrate is carried in/out with respect to the processing section 2, and a controller 4. The substrate is not particularly limited, and is, for example, a semiconductor wafer (hereinafter, simply referred to as a wafer).

The processing section 2 includes a plurality (eight in the example) of processing modules PM1 to PM8 that performs, for example, a film formation processing on a substrate W, a transfer unit 12 including a plurality of transfer modules TM1 to TM4 that sequentially transfers the substrate W to the plurality of processing modules PM1 to PM8, and a film thickness measuring apparatus 35 that measures a film thickness of a formed film.

The processing modules PM1 to PM8 are configured to form a plurality of films on a substrate, and includes one for actually performing a film formation processing such as sputtering, and one for performing, for example, a cleaning processing, a pre-processing, and a cooling processing. In the processing module, a processing is performed in vacuum. Here, the example in which eight processing modules are provided is illustrated. However, the present disclosure is not limited thereto, and the number of the processing modules may be set to a required number depending on the processing.

The transfer modules TM1 to TM4 include, respectively, containers 30a, 30b, 30c, and 30d having a hexagonal shape in plan view and held in vacuum, and transfer mechanisms 31a, 31b, 31c, and 31d provided in each of the containers. Delivery portions 41, 42, and 43 serving as transfer buffers are provided respectively between the transfer mechanisms of the transfer modules TM1 to TM4. The containers 30a, 30b, 30c, and 30d of the transfer modules TM1 to TM4 are communicated with each other.

The transfer module 12 configured by arranging the plurality of transfer modules TM1 to TM4 in a Y direction in the drawing, and four of the eight processing modules PM1 to PM8 are connected to each side of the transfer module 12 via gate valves G that is openable and closable. The gate valves G for the processing modules PM1 to PM8 are opened when the transfer mechanism of the transfer module is accessed to the processing module, and are closed when the processing is performed. Further, the film thickness measuring apparatus 35 is connected to a tip end portion of the container 30d of the transfer unit 12 via a gate valve G3.

The carry-in/out section 3 is connected to one end side of the processing section 2. The carry-in/out section 3 includes an atmospheric transfer chamber (EFEM) 21, three load ports 22 connected to the atmospheric transfer chamber 21, an aligner module 23, and two load lock modules LLM1 and LLM2. A transfer device 24 is provided in the atmospheric transfer chamber 21.

The atmospheric transfer chamber 21 has a rectangular parallelepiped shape with the X direction as the longitudinal direction in the drawing. The three load ports 22 are provided on a long side wall of the atmospheric transfer chamber 21 on the side opposite to the processing section 2. Each load port 22 has a stage 25 and a transfer port 26, a FOUP 20 serving as a wafer accommodating container that accommodates a plurality of wafers is placed on the stage 25, and the FOUP 20 on the stage 25 is connected to the atmospheric transfer chamber 21 via the transfer port 26 in a sealed state.

The aligner module 23 is connected to one short side wall of the atmospheric transfer chamber 21. Alignment of the wafer W is performed in the aligner module 23.

The two load lock modules LLM1 and LLM2 are configured to enable the transfer of the wafer W between the atmospheric transfer chamber 21 having an atmospheric pressure and the transfer unit 12 having a vacuum atmosphere, and the pressure is variable between the atmospheric pressure and the vacuum similar to that of the transfer unit 12. The two load lock modules LLM1 and LLM2 have two transfer port, respectively, and one transfer port is connected to the long side wall of the atmospheric transfer chamber 21 on the processing section 2 side via a gate valve G2, and the other transfer port is connected to the container 30a of the transfer unit 12 in the processing section 2 via a gate valve G1.

The load lock module LLM1 is used to transfer the wafer W from the carry-in/out section 3 to the processing section 2, and the load lock module LLM2 is used to transfer the wafer W from the processing section 2 to the carry-in/out section 3. A processing such as a degassing processing may be performed by the load lock modules LLM1 and LLM2.

The transfer device 24 in the atmospheric transfer chamber 21 has an articulated structure, and transfers the wafer W to the FOUP 20 on the load port 22, and the load lock modules LLM1 and LLM2. Specifically, the transfer device 24 takes out an unprocessed wafer W from the FOUP 20 on the load port 22, and transfers the wafer W to the load lock module LLM1. Further, the transfer device 24 receives the processed wafer W transferred to the load lock module LLM2 from the processing section 2, and transfers the wafer W to the FOUP 20 on the load port 22. In FIG. 1, the example in which the transfer device 24 has one pick that receives the wafer W is illustrated, but the number of picks may be two.

In the processing section 2, the processing modules PM1, PM3, PM5, and PM7 are disposed in the order from the load lock module LLM1 side on one side of the transfer unit 12, and the processing modules PM2, PM4, PM6, and PM8 are disposed in the order from the load lock module LLM2 on the other side of the transfer unit 12. Further, in the transfer unit 12, the transfer modules TM1, TM2, TM3, and TM4 are disposed in the order from the load lock modules LLM1 and LLM2.

The transfer mechanism 31a of the transfer module TM1 is accessible to the load lock modules LLM1 and LLM2, the processing modules PM1 and PM2, and the delivery portion 41. The transfer mechanism 31b of the transfer module TM2 is accessible to the processing modules PM1, PM2, PM3, and PM4, and the delivery portions 41 and 42. The transfer mechanism 31c of the transfer module TM3 is accessible to the processing modules PM3, PM4, PM5, and PM6, and the delivery portions 42 and 43. The transfer mechanism 31d of the transfer module TM4 is accessible to the processing modules PM5, PM6, PM7, and PM8, the delivery portion 43, and the film thickness measuring apparatus 35.

The film thickness measuring apparatus 35 is configured to measure a film thickness of a film formed by a certain processing module, and a film thickness of a stacked film after being stacked in-situ. The position of the film thickness measuring apparatus 35 is not limited to the position of the example. Further, the number of the film thickness measuring apparatuses 35 may be plural. Details of the film thickness measuring apparatus 35 will be described later.

Since the transfer device 24 and the transfer modules TM1 to TM4 of the transfer unit 12 are configured in this manner, in the processing section 2, the substrate W taken out from the FOUP 20 is serially transferred in one direction along a substantially U-shaped path in the order of the processing modules PM1, PM3, PM5, PM7, PM8, PM6, PM4, and PM2, processed in each processing module, and returned to the FOUP 20.

The controller 4 controls each component of the film forming system 1, for example, the transfer modules TM1 to TM4 (transfer mechanisms 31a to 31d), the transfer device 24, the processing modules PM1 to PM8, the load lock modules LLM1 and LLM2, the transfer unit 12, the gate valves G, G1, G2, G3, and the film thickness measuring apparatus 35. The controller 4 is configured by a computer, and is provided with a main controller including a CPU, an input device, an output device, a display device, and a storage device. The storage device is provided with a storage medium in which a processing recipe is stored. The main controller causes the film forming system 1 to perform a predetermined operation based on the processing recipe called from the storage medium.

In the film forming system 1 configured in this manner, first, the substrate W is taken out from the FOUP 20 on the load port 22 by the transfer device 24, and is transferred to the aligner module 23. After the wafer W is aligned by the aligner module 23, the substrate W is taken out by the transfer device 24, and is transferred to the load lock module LLM1. At this time, the load lock module LLM1 is at an atmospheric pressure, and is evacuated after receiving the substrate W.

Thereafter, the substrate W is taken out from inside the load lock module LLM1 by the transfer mechanism 31a of the transfer module TM1 of the transfer unit 12. The substrate W taken out is transferred to the processing module PM1 by the transfer mechanism 31a, and a predetermined processing is performed in the processing module PM1.

After the processing in the processing module PM1 is ended, the gate valve G on the carry-out side of the processing module PM1 is opened, and the substrate W is carried out by the transfer mechanism 31b of the transfer module TM2. The substrate W carried out is transferred to the processing module PM3 by the transfer mechanism 31b, and a predetermined processing is performed in the processing module PM3.

After the processing in the processing module PM3 is ended, the gate valve G on the carry-out side of the processing module PM3 is opened, and the substrate W is carried out by the transfer mechanism 31c of the transfer module TM3. The substrate W carried out is transferred to the processing module PM5 by the transfer mechanism 31c, and a predetermined processing is performed in the processing module PM5.

After the processing in the processing module PM5 is ended, the gate valve G on the carry-out side of the processing module PM5 is opened, and the substrate W is carried out by the transfer mechanism 31d of the transfer module TM4. The substrate W carried out is transferred to the processing module PM7 by the transfer mechanism 31d, and a predetermined processing is performed in the processing module PM7.

After the processing in the processing module PM7 is ended, the gate valve G of the processing module PM7 is opened, and the substrate W is carried out by the transfer mechanism 31d of the transfer module TM4. The substrate W carried out is transferred to the processing module PM8 by the transfer mechanism 31d, and a predetermined processing is performed in the processing module PM8.

Thereafter, the substrate W is sequentially transferred to the processing modules PM6, PM4, and PM2 by the transfer mechanisms 31c, 31b, and 31a of the transfer modules TM3, TM2, and TM1, and a predetermined processing is performed in the processing modules PM6, PM4, and PM2.

After the processing in the processing module PM2 is ended, the substrate W is transferred to the load lock module LLM2 by the transfer mechanism 31a. At this time, the load lock module LLM2 is in a vacuum, and is opened to the atmosphere after receiving the wafer W. Thereafter, the substrate W in the load lock module LLM2 is transferred to the FOUP 20 on the load port 22 by the transfer device 24.

As described above, the substrate W may be sequentially and serially transferred in a U-shape to a plurality of modules to perform a series of film forming processings.

In the process of the series of film forming processings, when a certain film is formed and then it is necessary to measure the film thickness of the film, the substrate W on which the film is formed is transferred to the film thickness measuring apparatus 35 to measure the film thickness. At this time, the substrate W is carried out from the processing module after film formation by the transfer mechanism of the corresponding transfer module, and if necessary, moved to one or two or more transfer mechanisms, and transferred to the film thickness measuring apparatus 35 by the transfer mechanism 31d. The film thickness may be measured each time the film forming processing is performed by each processing module for forming a film, may be measured after the film forming processing is performed in some processing modules, or may be measured after all the films are formed.

[Film Thickness Measuring Apparatus]

Next, the film thickness measuring apparatus will be described in detail.

Figure 2:
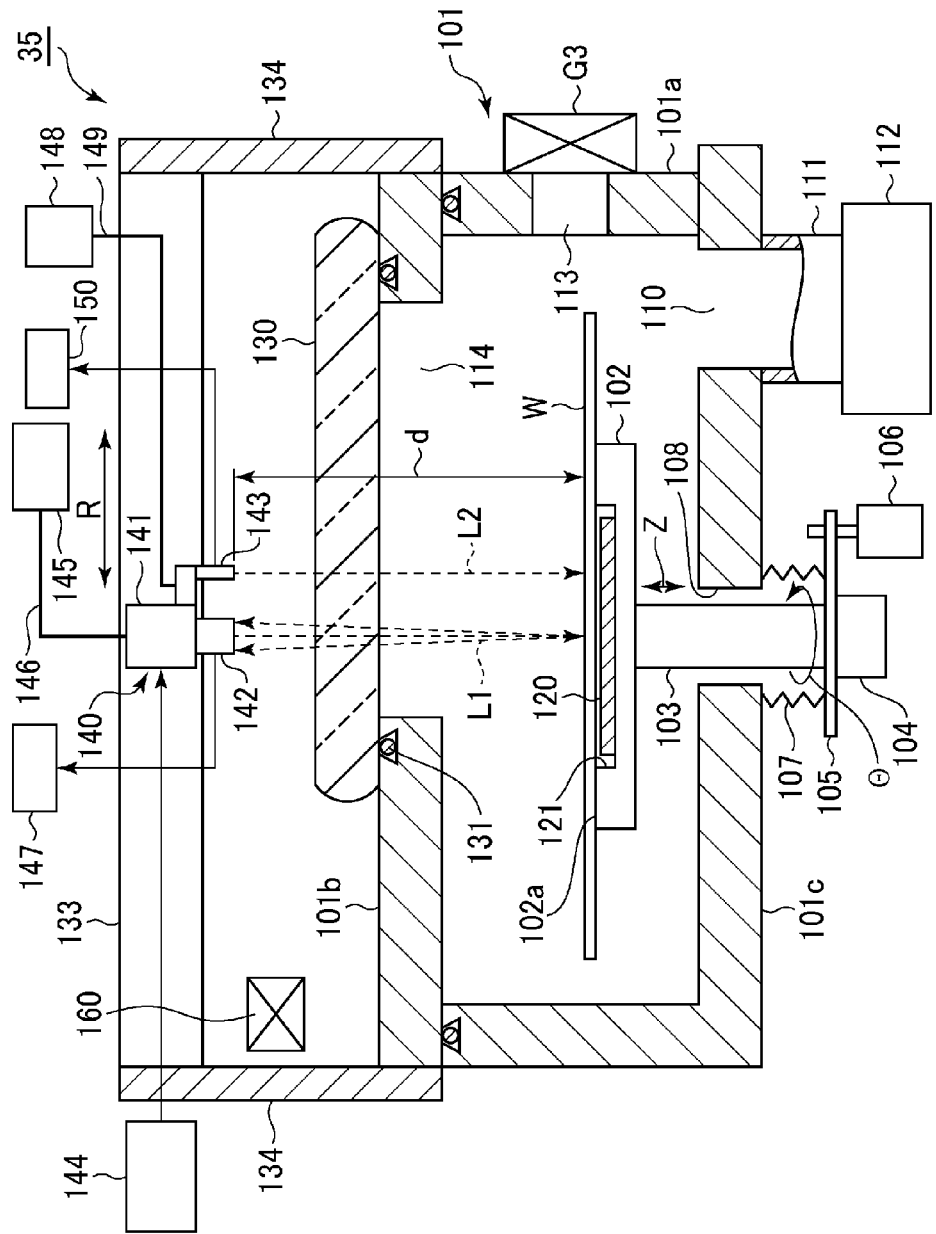
FIG. 2 is a cross-sectional view illustrating an example of the film thickness measuring apparatus.

FIG. 2 is a cross-sectional view illustrating an example of the film thickness measuring apparatus. As illustrated in FIG. 2, the film thickness measuring apparatus 35 in the example includes a chamber 101. In the chamber 101, a stage 102 on which the substrate W is placed and which may be rotated and moved up and down is provided. A shaft 103 is connected to the center of a bottom surface of the stage 102. The shaft 103 extends below the chamber 101 through a through hole 108 formed in a bottom wall 101c of the chamber 101, and is connected to the rotation mechanism 104. The stage 102 is configured to be rotated through the shaft 103 by the rotation mechanism 104. Further, the rotation mechanism 104 is attached to an elevating plate 105, and the elevating plate 105 is connected to an elevating mechanism 106. The elevating mechanism 106 is configured by, for example, a piezoelectric actuator, and a height position of the stage 102 may be finely adjusted via the elevating plate 105 and the shaft 103. An expandable bellows 107 is air-tightly provided between the bottom wall 101c and the elevating plate 105 to surround the shaft 103.

An exhaust port 110 is formed in the bottom wall 101c of the chamber 101, the exhaust port 110 is connected to an exhaust pipe 111, and the exhaust pipe 111 is connected to an exhaust mechanism 112 including a pressure control valve or a vacuum pump. The inside of the chamber 101 becomes a desired vacuum state by operating the exhaust mechanism 112.

A substrate carry-in/out port 113 is provided in a side wall 101a of the chamber 101, and the substrate carry-in/out port 113 may be opened and closed by the gate valve G3 described above.

An elongated through hole 114 extending in the radial direction of the substrate W is formed in a ceiling wall (lid) 101b of the chamber 101. The through hole 114 is covered with a light transmission member 130 made of, for example, quartz, through which film thickness measurement light and distance measurement laser (to be described later) transmit. A gap between the light transmission member 130 and the ceiling wall 101b is sealed with a seal ring 131.

A recess 121 is formed on an upper surface of the stage 102, and a reference member 120 is disposed in the recess 121. The reference member 120 is made of a same material as the base portion (base) of the substrate W, for example, when the substrate W is a silicon wafer, made of silicon, and is used for measuring an output light amount of a light source. Further, the reference member 120 may also be used as a criterion for the film thickness measurement. Further, the stage 102 is provided with a substrate transfer elevating pin (not illustrated) to be projectable with respect to the surface of the stage 102. The stage 102 may be provided with a heater that performs a heating processing on the substrate W.

A light emitting/receiving assembly 140 is provided in an atmospheric region above the position corresponding to the through hole 114 of the chamber 101. The light emitting/receiving assembly 140 includes a main body 141, a measurement light emitting/detecting unit 142, and a distance measurement laser emitting/detecting unit 143. The measurement light emitting/detecting unit 142 and the distance measurement laser emitting/detecting unit 143 are attached to the main body 141 in an adjacent state. Above the chamber 101, a linear guide 133 that guides the main body 141 is horizontally disposed in a state of being supported by a support member 134 on the ceiling wall 101b of the chamber 101.

The main body 141 is configured as a slider guided by the linear guide 133, and the main body 141 is driven by a driving motor 144. Therefore, the entire light emitting/receiving assembly 140 including the measurement light emitting/detecting unit 142 and the distance measurement laser emitting/detecting unit 143 is configured to be horizontally scanned along the linear guide 133. The light emitted from the measurement light emitting/detecting unit 142 and the laser light emitted from the distance measurement laser emitting/detecting unit 143 are irradiated onto the substrate W through the light transmission member 130 and the through hole 114, and the irradiation point may be scanned in the radial direction (R direction). Further, with the rotation of the substrate W on the stage 102 by the rotation mechanism 104, the irradiation points of the light emitted from the measurement light emitting/detecting unit 142 and the laser light emitted from the distance measurement laser emitting/detecting unit 143 may be scanned in a circumferential direction (Θdirection) on the substrate W. That is, the driving motor 144 and the rotation mechanism 104 function as a moving mechanism that moves the irradiation points of the light emitted from the measurement light emitting/detecting unit 142 and the laser light emitted from the distance measurement laser emitting/detecting unit 143 on the substrate.

The measurement light emitting/detecting unit 142 includes a light emitting unit that emits film thickness measurement light L1 toward the substrate W, and a light receiving sensor that detects reflected light of the emitted light. Light is induced to the light emitting unit through an optical fiber 146 from a light source unit 145. The light source unit 145 includes, for example, a light source, an amplifier that amplifies the light from the light source, an optical system, and a sensor. A lamp light source that emits broad light having a short wavelength of about 800 nm or less may be used as the light source. The film thickness is measured by the spectroscopic interference method using the light source. Therefore, the film thickness of an extremely thin film having a film thickness of 10 nm or less, and further, 1 nm or less may be measured. The light receiving sensor receives reflected light emitted from the light emitting unit and reflected by the substrate W. A detection signal detected by the light receiving sensor is sent to a film thickness measuring unit 147, and the film thickness of the film on the substrate W is measured. A film thickness measurement unit is configured by the measurement light emitting/detecting unit 142, the light source unit 145, the optical fiber 146, and the film thickness measuring unit 147.

The distance measurement laser emitting/detecting unit 143 includes a laser emitting unit that emits distance measurement laser L2 downward (stage 102), and a distance measurement light receiving sensor that receives reflected light of the laser. Laser light is induced to the laser emitting unit through an optical fiber 149 from a laser light source unit 148. A detection signal detected by the distance measurement light receiving sensor is sent to a distance measuring unit 150, and a distance d between the light receiving sensor of the measurement light emitting/detecting unit 142 and the substrate W is measured. A laser distance meter is configured by the distance measurement laser emitting/detecting unit 143, the laser light source unit 148, the optical fiber 149, and the distance measuring unit 150.

Above the chamber 101, a cooling fan 160 configured to cool the light emitting/receiving assembly 140 is provided. The cooling fan 160 is effective, particularly when the stage 102 is heated by a heater.

A cover may be provided in an optical path of the measurement light emitting/detecting unit 142 and the distance measurement laser emitting/detecting unit 143. Adverse effects on, for example, the sensor due to light leakage may be prevented by providing the cover.

Next, descriptions will be made on a measurement procedure in the film thickness measuring apparatus 35 configured as described above with reference to FIGS. 3A to 3F to 5A to 5E.

FIGS. 3A to 3F are views illustrating a procedure of a previous step of measuring a film thickness of a film formed on the substrate W. First, as illustrated in FIG. 3A, the film thickness measuring apparatus 35 is set to a standby state. At this time, the inside of the chamber 101 is kept at the vacuum pressure similar to that of the containers 30a, 30b, 30c, and 30d of the transfer unit 12 by the exhaust mechanism 112, and the film thickness measurement unit (measurement light emitting/detecting unit 142) and the laser distance meter (distance measurement laser emitting/detecting unit 143) are set to an ON state. Subsequently, as illustrated in FIG. 3B, the stage 102 is raised such that the surface of the reference member 120 is aligned with the measurement surface, and as illustrated in FIG. 3C, the reference member 120 is irradiated with film thickness measurement light through the measurement light emitting/detecting unit 132 from the light source of the light source unit 145 to perform reference measurement. At this time, an output light amount of the light source is measured by irradiating the reference member 120 with light from the light source of the light source unit 145, and it is confirmed whether or not the light source output is within the criterion. When the output value is lower than the criterion, the light source may be deteriorated, and thus, the measurement is stopped and replacement of the light source (lamp) is prompted to a user by, for example, generating an alarm from the film thickness measuring apparatus 35. Further, data serving as a criterion for film thickness measurement may be obtained by the reference measurement. Subsequently, as illustrated in FIG. 3D, the stage 102 is lowered to a substrate carry-in position, and the substrate W is carried into the chamber 101 and placed on the stage (see FIGS. 3E and 3F).

Figure 4A:
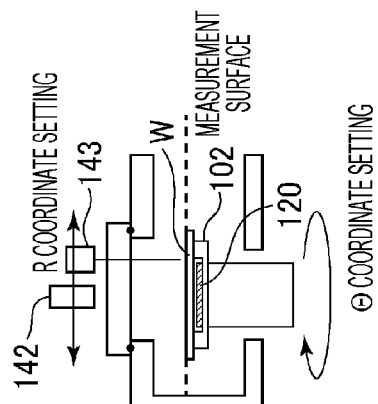
FIGS. 4A to 4C are views illustrating a procedure for measuring a distance from a measurement point on a substrate in a Z direction.
Figure 4B:
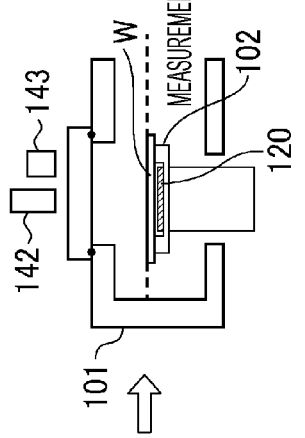
Figure 4C:
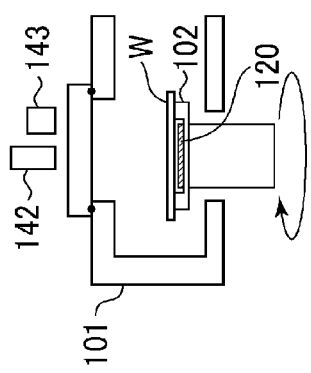

Subsequently, a distance from a measurement point on the substrate W in the Z direction is measured. FIGS. 4A to 4C are views illustrating a procedure for measuring the distance from the measurement point on the substrate W in the Z direction.

First, as illustrated in FIG. 4A, a reference position of the substrate W is measured. For example, when the substrate W is a wafer, notch position alignment is performed. Subsequently, as illustrated in FIG. 4B, the height position of the surface of the substrate W is moved to the measurement surface. The positional alignment at this time is performed at a specific position on the substrate W. Subsequently, as illustrated in FIG. 4C, the distances to the substrate W at a plurality of film thickness measurement positions on the substrate W, that is, the distance (distance in the Z direction) between the light receiving sensor of the measurement light emitting/detecting unit 142 and the irradiation point on the substrate W is measured by the distance measurement laser emitting/detecting unit 143. At this time, the R direction position (R coordinate) of the distance measurement laser emitting/detecting unit 143 and the Θ direction position (Θ coordinate) of the substrate W are adjusted by the driving motor 144 and the rotation mechanism 104, respectively, to sequentially irradiate the plurality of film thickness measurement positions with the distance measurement laser.

Next, the film thickness is actually measured at the film thickness measurement position where the distance in the Z direction is measured. FIGS. 5A to 5E are views illustrating a procedure for actually measuring the film thickness at the film thickness measurement position where the distance in the Z direction is measured.

First, as illustrated in FIG. 5A, the position of the measurement light emitting/detecting unit 142 is adjusted by the driving motor 144, and an angle of the substrate W is adjusted by the rotation mechanism 104. Therefore, the R-Θ coordinate of the irradiation point where light is irradiated from the measurement light emitting/detecting unit 142 to the substrate W is adjusted to be one of the plurality of film thickness measurement positions. Subsequently, as illustrated in FIG. 5B, the Z direction distance is corrected by the elevating mechanism 106 based on the measurement result of the distance (Z direction distance) between the light receiving sensor and the irradiation point (film thickness measurement position) by the laser distance meter (distance measurement laser emitting/detecting unit 143). Subsequently, as illustrated in FIG. 5C, light is irradiated on the substrate from the light emitting unit of the film thickness measurement unit (measurement light emitting/detecting unit 142), and reflected light from the irradiation point (film thickness measurement position) is detected by the light receiving sensor, and then, the film thickness of the film at the film thickness measurement position is measured. Subsequently, as illustrated in FIG. 5D, in the same manner, the R-Θ coordinate of the irradiation point of the light from the measurement light emitting/detecting unit 142 to the substrate W is sequentially adjusted to be the other one of the plurality of film thickness measurement positions, and the Z direction distance of the film thickness measurement position is sequentially corrected, and then, the film thickness at the other one of the film thickness measurement positions is measured. When the film thickness measurement is ended at all measurement points, as illustrated in FIG. 5E, the substrate W is carried out.

The film forming system 1 is used for forming a stacked film by forming a plurality of extremely thin films, for example, for forming a stacked film used in a MRAM. At this time, the film thickness of one layer is 10 nm or less, and further, 1 nm or less, which is an extremely thin film. The film thickness measuring apparatus 35 is configured to measure the film thickness of an extremely thin film formed by the film forming system 1 in-situ, and the film thickness may be measured with high accuracy by measuring the film thickness by the spectroscopic interference method using broad light having a short wavelength.

However, in the film thickness measurement of an extremely thin film of 10 nm or less, and further 1 nm or less, which is required to measure the film thickness in-situ, it is found that displacement in the height direction (Z direction) due to, for example, warpage of the substrate W serving as a measurement target affects the film thickness measurement accuracy. That is, it is found that, when the displacement in the Z direction occurs in the substrate W, the distance between the light receiving sensor and the film thickness measurement position on the substrate W is changed, which causes an error in the measured film thickness.

Figure 6:
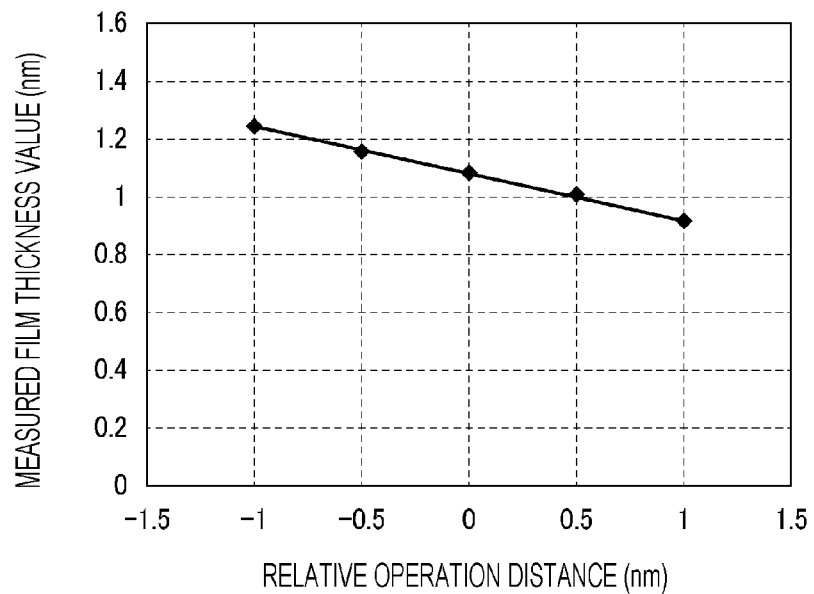
FIG. 6 is a view illustrating a relationship between a relative operation distance (amount of change in a distance between a light receiving sensor and a measurement target) and a measured film thickness value.

FIG. 6 is a view illustrating a relationship between a relative operation distance (amount of change in a distance between the light receiving sensor and the measurement target) and a measured film thickness value. From the drawing, it is found that the measured film thickness depends on the distance between the light receiving sensor and the measurement target, and when the distance is changed by 1 mm, an error of 0.2 nm occurs in the measured film thickness. Therefore, when it is required to measure the film thickness of 10 nm or less, and further 1 nm or less, such error is not allowable.

Therefore, in the example, the distance (Z direction distance) between the light receiving sensor and the film thickness measurement position on the substrate W is measured with high accuracy by the laser distance meter (distance measurement laser emitting/detecting unit 143), and the distance may be corrected by the elevating mechanism 106. Therefore, accuracy deterioration in the film thickness measurement does not occur even when Z direction displacement such as warpage of the substrate W occurs, and it is possible to measure the film thickness of an extremely thin film of 10 nm or less, and further 1 nm or less required for measuring the film thickness in-situ with high accuracy.

Further, in the example, film thickness measurement light may be quickly irradiated to an arbitrary position on the substrate W by moving the measurement light emitting/detecting unit 142 in the R direction and rotating the substrate W in the Θ direction. Therefore, a rapid film thickness measurement corresponding to the film thickness measurement in-situ may be implemented.

Figure 7:
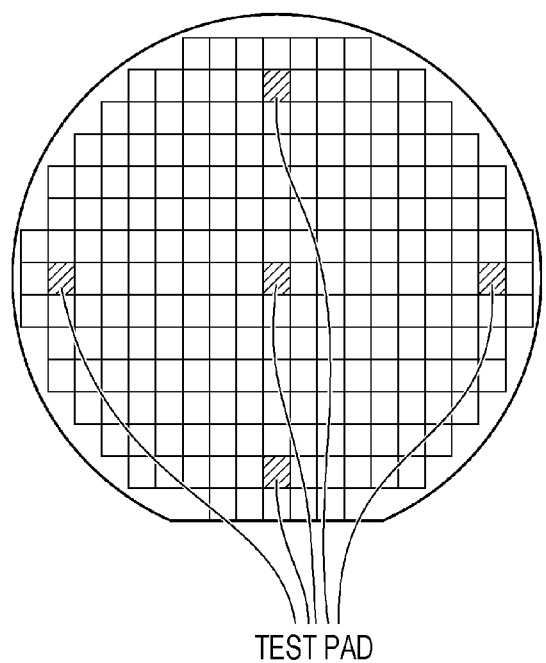
FIG. 7 is a schematic view illustrating an actual wafer including test pads capable of measuring a film thickness.

As illustrated in FIG. 7, in an actual wafer used as the substrate W, test pads capable of measuring the film thickness are formed at arbitrary positions. Since a device is not formed in the test pads, the film thickness may be easily measured. Even when the film thickness is measured with the test pads at a plurality of locations, as described above, the light irradiation position may be quickly changed, and thus, the film thickness measurement may be completed in a short time. Further, the coordinates of the position of the test pad are stored according to the type of the wafer, and as described above, the light irradiation position may be quickly set by the movement of the light emitting/receiving assembly 140 in the R direction and the rotation (Θ direction movement) of the stage 102, based on the stored information.

When the film thickness is measured by the optical interference method, the film thickness of the formed film is changed depending on the optical constant of the base. As a result, although the film thickness is measured with the test pad as described above, if the optical constant of the base is known, the film thickness of the film with an actual pattern may be measured, and thus, the film thickness may be measured with higher accuracy. In the actual pattern, a plurality of film is stacked, and it is possible to measure up to approximately ten layers with high accuracy.

Further, the reference member 120 may be provided in the stage 102, and the reference measurement may be performed by adjusting the height by the laser distance meter (distance measurement laser emitting/detecting unit 143), and thus, it is unnecessary to use a reference substrate. This aspect is also advantageous for the film thickness measurement in-situ.

A technology in which, in a film forming system including a plurality of processing modules, a module that measures a film thickness is connected to measure the film thickness in-situ is disclosed in Japanese Patent Laid-Open Publications Nos. 05-149720 and 11-330185. However, the technology measures the film thickness using laser, and does not consider the film thickness measurement of an extremely thin film such as the MRAM of 10 nm or less, and further 1 nm or less. Therefore, in the related art, the film thickness measurement of the MRAM film have to be performed after carrying out the film on which a laminated film is formed from the film forming system.

In contrast, in the film thickness measuring apparatus in the example, the film thickness measurement of the extremely thin film of 10 nm or less, and further 1 nm or less may be performed in the film forming system in-situ.

Next, another example of the film thickness measuring apparatus will be described.

Figure 8:
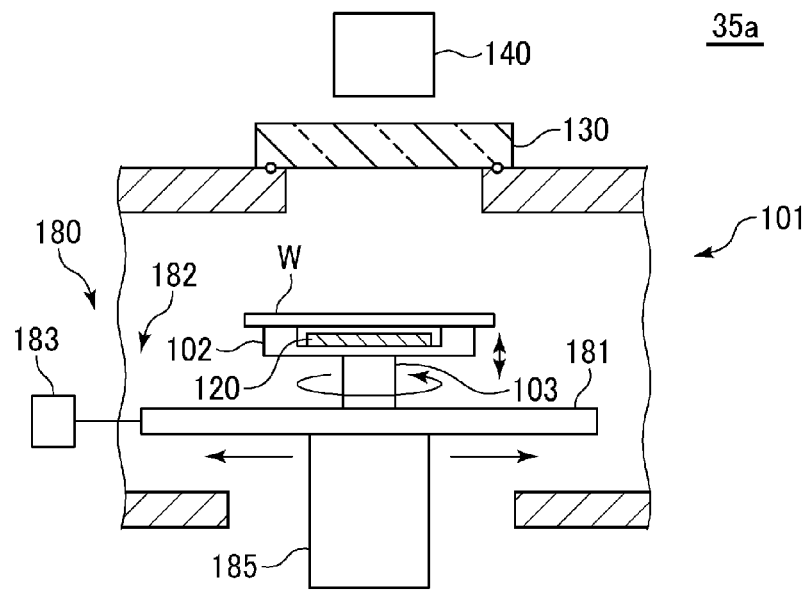
FIG. 8 is a partial cross-sectional view illustrating a main part of another example of the film thickness measuring apparatus.

FIG. 8 is a cross-sectional view illustrating a main part of another example of the film thickness measuring apparatus.

In a film thickness measuring apparatus 35a in the example, a mechanism that performs positional adjustment in the horizontal direction (R direction) of the position on the substrate W irradiated with the film thickness measurement light is different from the film thickness measuring apparatus 35 in FIG. 2. In FIG. 8, the same components as those in FIG. 2 are designated by the same reference numerals, and the description thereof will be omitted.

As illustrated in FIG. 8, the film thickness measuring apparatus 35a includes a horizontal driving mechanism 180 capable of moving the stage 102 in the horizontal direction, and the stage 102 may be moved in the horizontal direction (R direction) in addition to rotating/moving up and down. In the example, the rotation mechanism and the elevating mechanism are accommodated in a case 185, and the stage 102 may be horizontally moved together with the case 185. The horizontal driving mechanism 180 includes a guide rail 181 that guides the stage 102 together with the case 185 via a slider (not illustrated) in the horizontal direction, and a driving unit 182 configured to drive the stage 102 together with the case 185 in the horizontal direction. In the example, the driving unit 182 is configured as a ball screw mechanism having a rotary motor 183. That is, in the example, the driving unit 182 includes a ball screw (not illustrated) that horizontally extends in parallel with the guide rail 181, and is screwed into the case 185. Then, by rotating the ball screw by the rotary motor 183, the case 185 is horizontally moved along the guide rail 181 via the slider to horizontally move the stage 102. The gap between the chamber 101 and the case 185 is configured such that the inside of the chamber 101 is shielded from the atmospheric by a shielding mechanism (not illustrated) such as a bellows.

The horizontal driving mechanism 180 is not limited to the one that uses the ball screw mechanism as long as it is capable of moving the stage 102 horizontally. For example, the case 185 may be self-propelled along the guide rail 181 by a motor, for example, provided on a slider.

The light emitting/receiving assembly 140 is fixed to an upper wall of the chamber 101, unlike the film thickness measuring apparatus 35 in the above example.

In the film thickness measuring apparatus 35a configured as the above, the horizontal direction (R direction) of the light irradiation position is adjusted by moving the stage 120 in the horizontal direction (R direction) by the horizontal driving mechanism 180, instead of moving the light emitting/receiving assembly 140 in the horizontal direction (R direction) as in the film thickness measuring apparatus 35. Therefore, similarly to the film thickness measuring apparatus 35 in the above example, the film thickness measurement light may be quickly irradiated to an arbitrary position on the substrate W.

In the example, although the light emitting/receiving assembly 140 is fixed and the stage 102 is enabled to be moved in the horizontal direction (R direction), both the stage 102 and the light emitting/receiving assembly 140 may be movable in the horizontal direction (R direction).

Next, yet another example of the film thickness measuring apparatus will be described.

Figure 9:
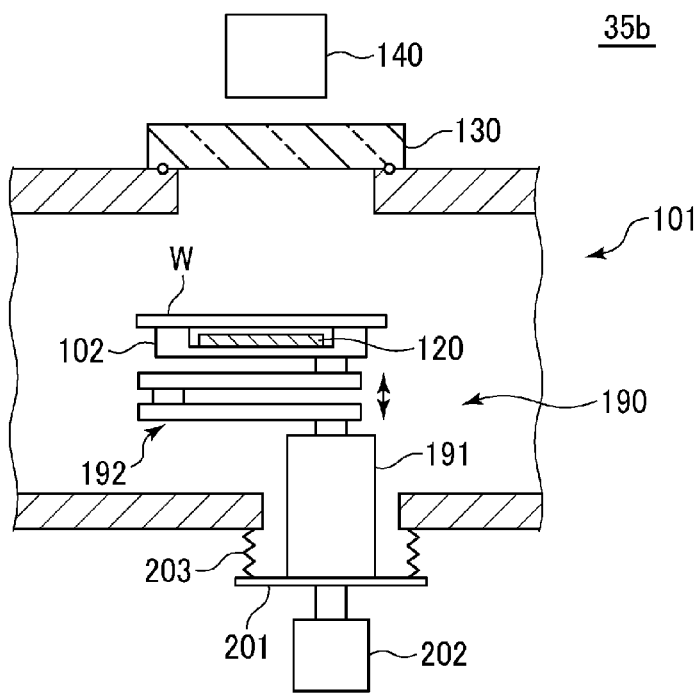
FIG. 9 is a partial cross-sectional view illustrating a main part of yet another example of the film thickness measuring apparatus.

FIG. 9 is a cross-sectional view illustrating a main part of yet another example of the film thickness measuring apparatus.

In a film thickness measuring apparatus 35b in the example, a mechanism that performs positional adjustment of the position on the substrate W irradiated with the film thickness measurement light is different from the film thickness measuring apparatus 35 in FIG. 2. In FIG. 9, the same components as those in FIG. 2 are designated by the same reference numerals, and the description thereof will be omitted.

As illustrated in FIG. 9, the film thickness measuring apparatus 35b includes a stage moving mechanism 190 capable of arbitrarily moving the stage 102 in the horizontal plane. In the example, the stage moving mechanism 190 includes a driving unit 191, and an articulated arm 192. The articulated arm 192 has a structure in which a plurality of arms are connected by rotatable connecting portions, and supports the stage 102 at the upper end, and thus, may move the stage 102 to an arbitrary position on the horizontal plane. The driving unit 191 drives the articulated arm 192.

The driving unit 191 is attached to an elevating plate 201, and the elevating plate 201 is connected to an elevating mechanism 202. The elevating mechanism 202 is configured by, for example, a piezoelectric actuator, and a height position of the stage 102 may be finely adjusted via the elevating plate 201 and the stage moving mechanism 190. An expandable bellows 203 is air-tightly provided between the bottom wall of the chamber 101 and the elevating plate 201 to surround the driving unit 191.

The stage moving mechanism 190 may be capable of moving the stage 102 in the horizontal plane such that the light emitted from the emitting unit of the light emitting/receiving assembly 140 is irradiated to an arbitrary position on the substrate W, and may be another one such as an XY stage.

The light emitting/receiving assembly 140 is fixed to the upper wall of the chamber 101, unlike the film thickness measuring apparatus 35 in the above example.

In the film thickness measuring apparatus 35b configured as described above, the stage moving mechanism 190 is capable of arbitrarily moving the stage 102 in the horizontal plane. As a result, the film thickness measurement light may be quickly irradiated to an arbitrary position on the substrate W by the stage moving mechanism 190.

In the example, the light emitting/receiving assembly 140 may be movable in the horizontal direction (R direction).

Another Embodiment of Film Forming System

Figure 10:
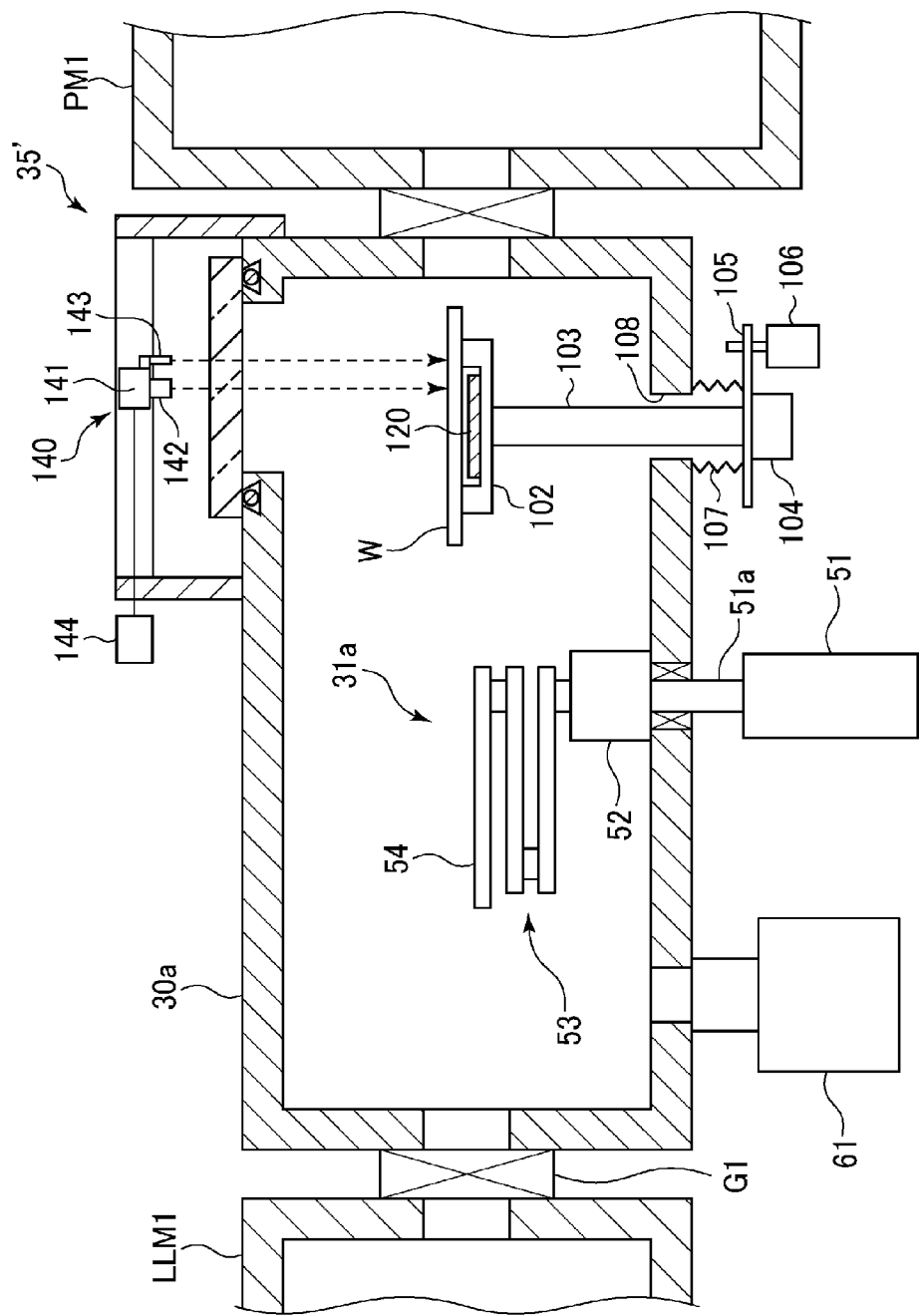
FIG. 10 is a cross-sectional view illustrating an embodiment provided with a film thickness measuring apparatus in a portion adjacent to a processing module of a transfer module.

FIG. 10 is a cross-sectional view illustrating an embodiment provided with a film thickness measuring apparatus 35' in a portion adjacent to the processing module PM1 of the transfer module TM1. As illustrated in FIG. 10, the transfer module TM1 includes the container 30a, the transfer mechanism 31a, and an exhaust mechanism 61.

The transfer mechanism 31a includes a driving mechanism 51, a base 52, a rotating/expanding portion 53, and a substrate support arm 54. The driving mechanism 51 is provided below the container 30a, and is configured to rotate a driving shaft 51a. The base 52 is fixed at the center of the bottom portion in the container 30a, and the driving shaft 51a is inserted therethrough. The rotating/expanding portion 53 has an articulated structure that is rotatable and expandable/contractable by the driving mechanism 51. The substrate support arm 54 supports and transfers the substrate W, and delivers the substrate W.

The film thickness measuring apparatus 35a is provided in a portion of the container 30a adjacent to the processing module PM1. The configuration of the film thickness measuring apparatus 35' is basically the same as that of the film thickness measuring apparatus 35, and the same components as those in the film thickness measuring apparatus 35 are designated by the same reference numerals, and the description thereof will be omitted.

As described above, by providing the film thickness measuring apparatus 35' in the transfer module TM1, it is not necessary to separately provide a film thickness measurement chamber, and thus, the space saving may be promoted. Further, the film thickness may be measured immediately after performing a film forming processing by the adjacent processing module PM1, and thus, the throughput may be increased. The same effect may be obtained by providing the film thickness measuring apparatus 35' in the transfer modules TM2 to TM4.

Figure 11:
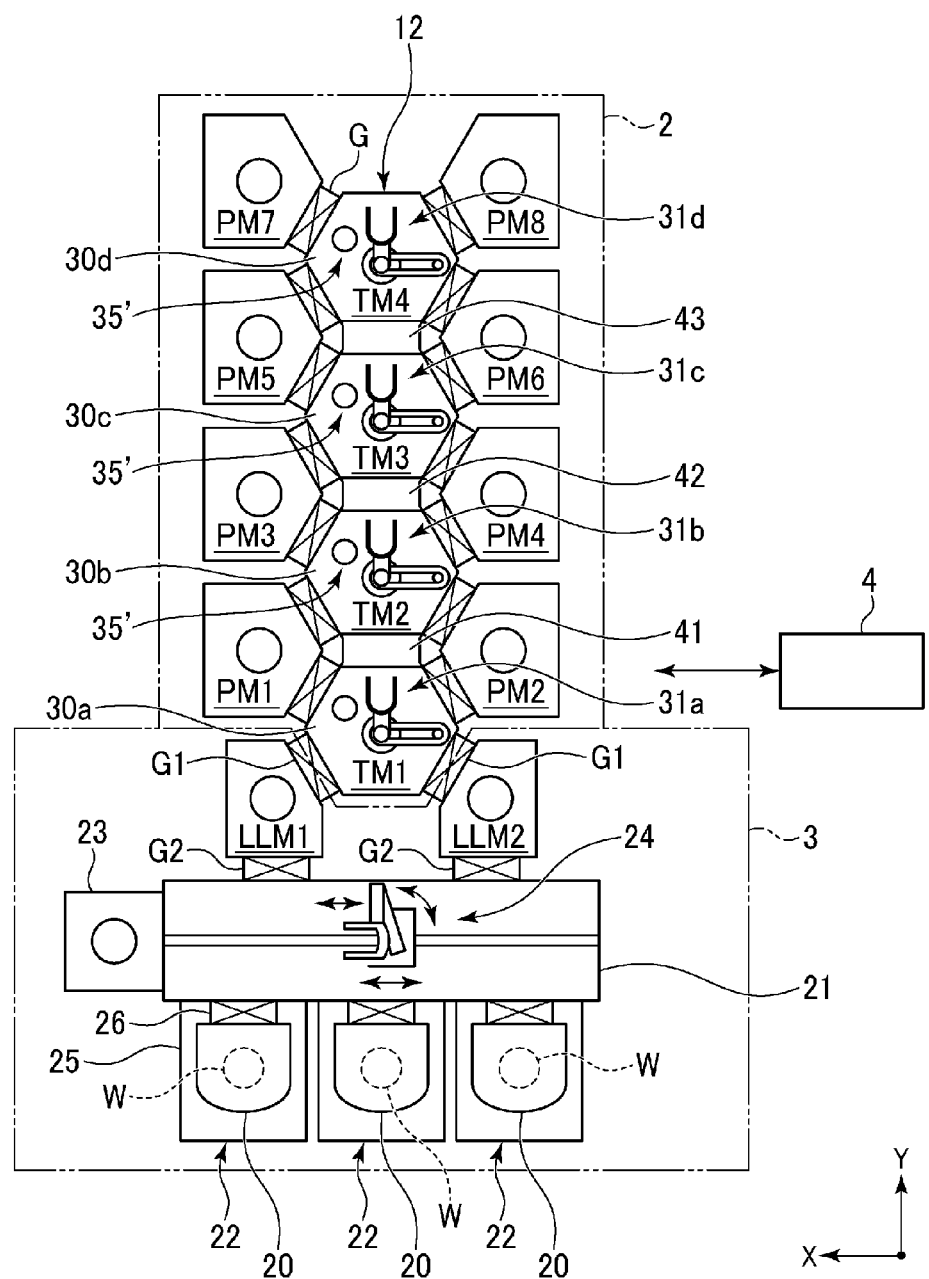
FIG. 11 is a plan view schematically illustrating an example of a film forming system provided with a film thickness measuring apparatus in all transfer modules.
Figure 12:
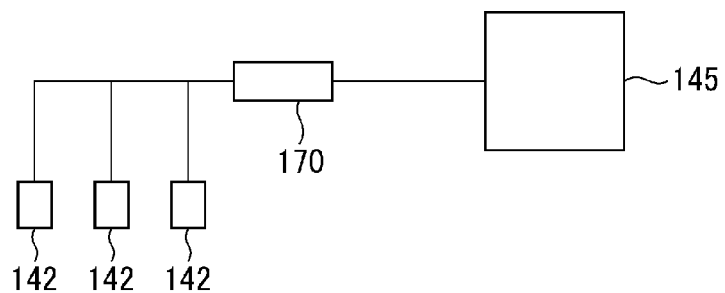
FIG. 12 is a view illustrating a state where, when using a plurality of film thickness measuring apparatuses, light is supplied by branching from one light source to a measurement light emitting/detecting unit of each of the film thickness measuring apparatuses.

Further, the film thickness measuring apparatus 35' may be provided two or more of the transfer modules TM1 to TM4, for example, all of the transfer modules TM1 to TM4 as illustrated in FIG. 11, whereby, the throughput may be further increased. Further, when a plurality of film thickness measuring apparatuses 35' are provided as described above, as illustrated in FIG. 12, the common light source unit 145 is used, and it is possible to branch (multi-channelization) to the measurement light emitting/detecting unit 142 of each film thickness measuring apparatus 35' by a branching unit 170, which is efficient.

Figure 13:
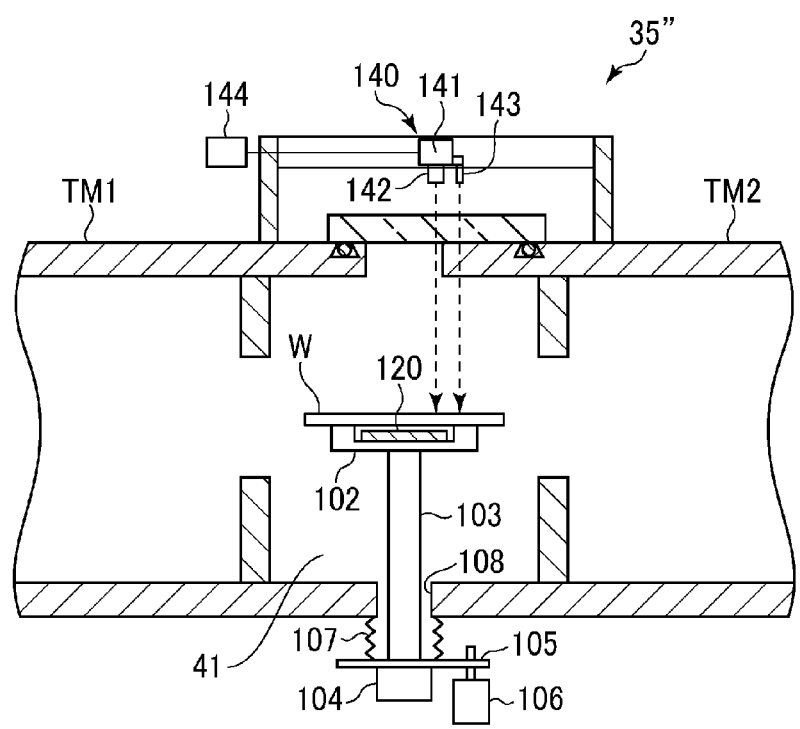
FIG. 13 is a cross-sectional view illustrating an embodiment provided with a film thickness measuring apparatus in a delivery portion between two transfer modules.

FIG. 13 is a cross-sectional view illustrating an embodiment provided with a film thickness measuring apparatus 35" in the delivery portion 41 between the transfer module TM1 and the transfer module TM2. The configuration of the film thickness measuring apparatus 35" is basically the same as that of the film thickness measuring apparatus 35, and the same components are designated by the same reference numerals, and the description thereof will be omitted.

As described above, by providing the film thickness measuring apparatus 35" in the delivery portion 41 between the transfer module TM1 and the transfer module TM2, it is not necessary to separately provide a film thickness measurement chamber, and thus, the space saving may be promoted. Further, the film thickness may be measured during the process of transferring the substrate W, and thus, the throughput may be increased. The same effect may be obtained by providing the film thickness measuring apparatus 35" in the delivery portions 42 and 43 between the adjacent transfer modules. Further, also in the case of the example, the film thickness measuring apparatus 35" may be provided in two or more of the delivery portions 41, 42, and 43, for example, all of the delivery portions 41, 42, and 43, and thus, the throughput may be further increased. Further, similarly, efficiency may be promoted by using the common light source unit 145 for the measurement light emitting/detecting unit 142 of each film thickness measuring apparatus 35".

The film thickness measuring apparatus 35' and the film thickness measuring apparatus 35" have the same configuration as the film thickness measuring apparatus 35, but may have the same configuration as the film thickness measuring apparatus 35a or the film thickness measuring apparatus 35b.

[Sequence of Forming a Plurality of Films and Film Thickness Measurement]

Next, descriptions will be made on a sequence when, in the film forming system 1, a plurality of films are continuously formed and the film thickness of each of the films is measured.

Figure 14:
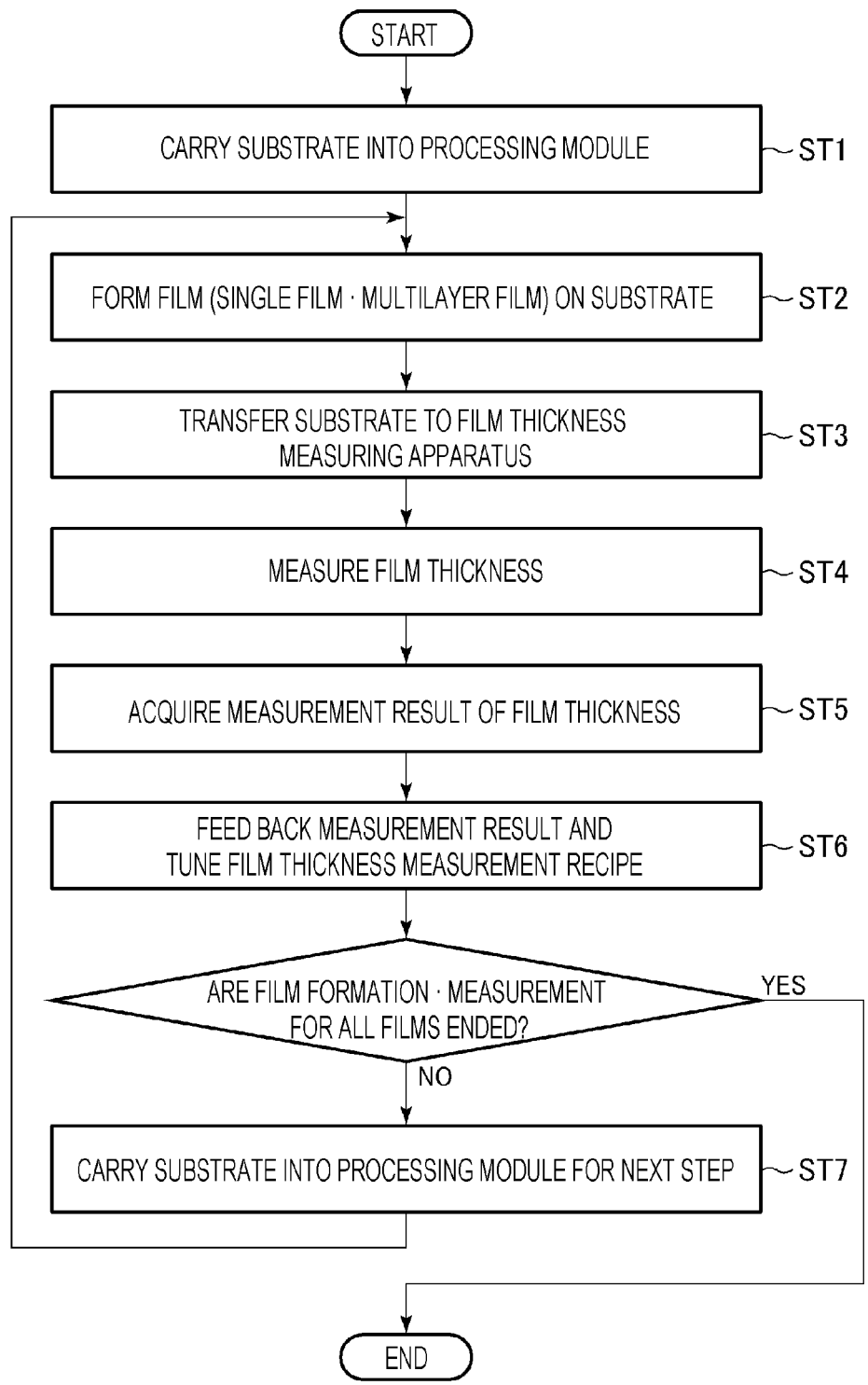
FIG. 14 is a flowchart illustrating a sequence when, in a film forming system 1, a plurality of films are continuously formed and a film thickness of each of the films is measured.

FIG. 14 is a flowchart illustrating the sequence at this time, and FIGS. 15A to 15E are cross-sectional views illustrating main steps of the sequence.

First, a wafer on which, for example, a $SiO_2$ film 302 is formed on a Si base 301 is prepared as the substrate W (FIG. 15A), and is carried into the processing module configured to form an initial film (step ST1).

Figure 15A:
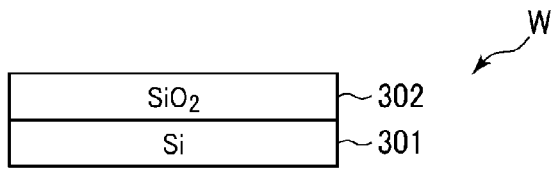
FIGS. 15A to 15E are cross-sectional views illustrating main steps of a sequence when, in a film forming system 1, a plurality of films are continuously formed and a film thickness of each of the films is measured.
Figure 15B:
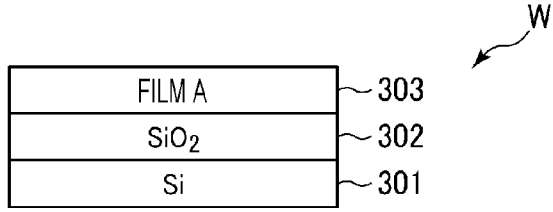

Subsequently, a predetermined film is formed on the $SiO_2$ film 302 by the processing module (step ST2, FIG. 15B). In FIG. 15B, a film A 303 is initially formed, and the film A 303 may be a single film or a multilayer film.

Figure 15C:
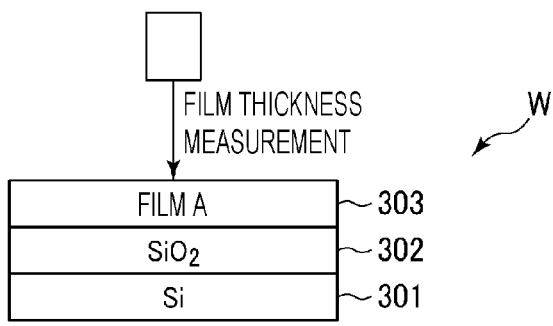
Figure 15D:
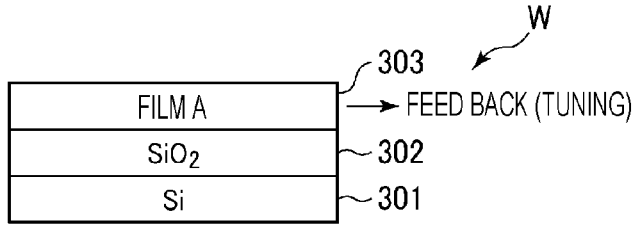

Subsequently, the substrate W on which the film is formed is transferred to the film thickness measuring apparatus 35 (step ST3), and the film thickness of the formed film (film A 303) is measured (step ST4, FIG. 15C). The film thickness may be measured by the film thickness measuring apparatuses (35a, 35b, 35', and 35").

Subsequently, a measurement result of the film thickness is acquired (step ST5). The measurement result of the film thickness is sent to the controller 4, and acquired by the controller 4. Then, the measurement result is fed back, and a film thickness measurement recipe is tuned (step ST6, FIG. 15D). That is, for example, the film thickness and the optical constant at the time when the formed film (film A 303) is measured are fed back to the film thickness measurement recipe as parameters of the multilayer film, and the film thickness measurement recipe is tuned.

Figure 15E:
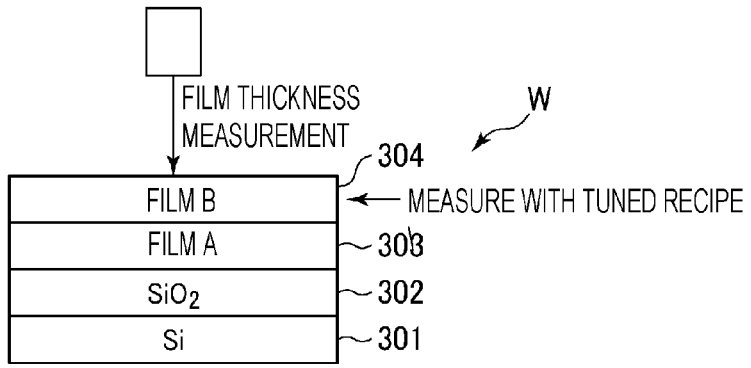

Subsequently, the substrate W is carried into a processing module for the next step (step ST7), a next film is formed on the substrate W (step ST2), and after the film is formed, the substrate is transferred to the film thickness measuring apparatus 35 (step ST3), and the film thickness of the next film is measured (step ST4, FIG. 15E). In FIG. 15E, a film B 304 is formed as the next film, and the film B may also be a single film or a multilayer film. When the film thickness of the next film (film B 304) is measured, the film thickness is measured with the tuned film thickness measurement recipe. At this time, optical characteristics of the base film (film A 303, $SiO_2$ film 302, and Si base 301) are tuned, and thus, high film thickness measurement accuracy may be obtained.

The film formation, the film thickness measurement, and the tuning as described above are repeated, and the sequence is terminated at the time point when the film formation and the film thickness measurement are completed for all the films.

When a plurality of films is continuously formed on a substrate by the sequence described above, a change in the state of the base affects the film thickness measurement accuracy of the formed film. In contrast, in the example, the measurement result of the film thickness measurement of the film formed earlier is fed back and the film thickness measurement recipe is tuned, and then, the film thickness of the next film is measured. As a result, the optical constant of the base film may be grasped when the next film is formed, and thus, the film thickness may be measured with high accuracy. When the optical constant of the base film is found, the film thickness may be repeatedly measured with high accuracy up to approximately 10 layers. Therefore, when a multilayer film is formed, the film thickness of each film may be measured with high accuracy.

Further, when a multilayer film is continuously formed by the film forming system 1, the film thickness may be measured in-situ by the film thickness measuring apparatus every time the film is formed by the processing module, which is extremely efficient.

Figure 16A:
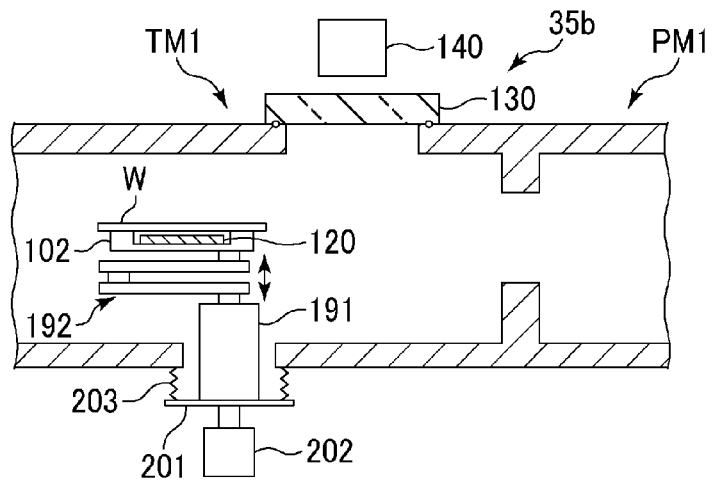
FIGS. 16A to 16C are cross-sectional views illustrating a step in which a film thickness measuring apparatus is disposed in a transfer module and the sequence in FIG. 14 is performed.
Figure 16B:
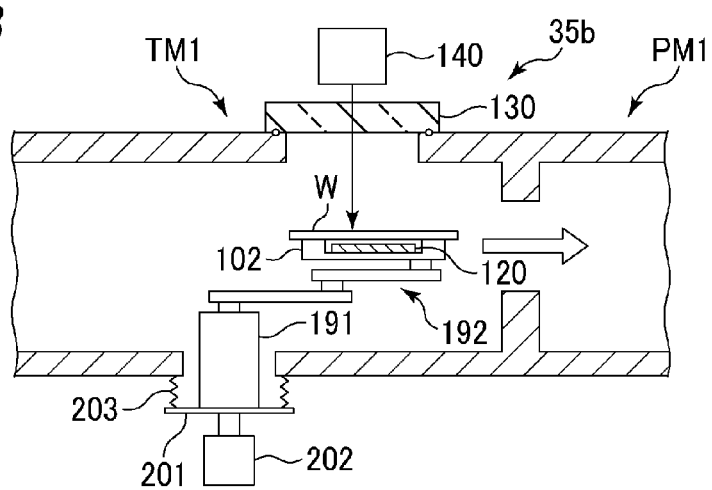
Figure 16C:
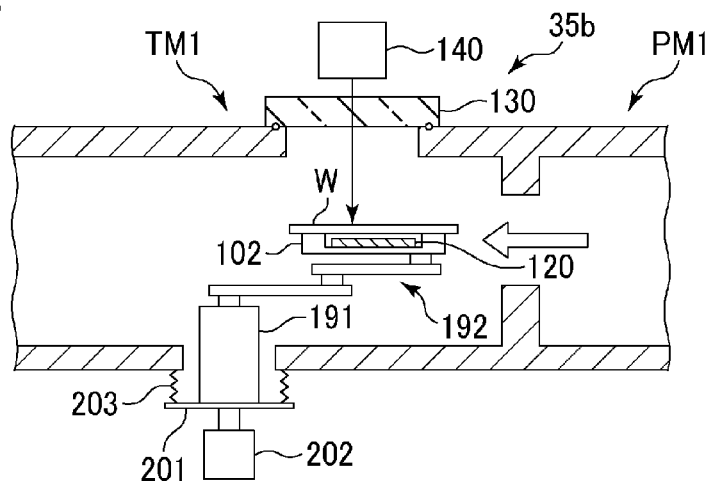

Particularly, by disposing the film thickness measuring apparatus in the transfer module, the film thickness may be measured with extremely efficiently and high accuracy, as described below with reference to FIGS. 16A to 16C. Here, for example, the stage moving mechanism 190 of the film thickness measuring apparatus in FIG. 9 described above is used as the transfer mechanism of the transfer module TM1, and both the transfer of the substrate W and the film thickness measurement are performed by the stage moving mechanism 190. That is, the stage 102 functions as a substrate support arm of the transfer mechanism, and the articulated arm 192 functions as a rotating/expanding portion of the articulated structure of the transfer mechanism (FIG. 16A). Then, the film thickness measuring apparatus 35b is configured together with the light emitting/receiving assembly 140. When a substrate on which a base film is formed is transferred from the transfer module TM1 to the processing module PM1 to form a next film, as illustrated in FIG. 16B, the film thickness of the base film is measured by the film thickness measuring apparatus 35b while the substrate W is transferred to the processing module PM1. At this time, the measurement result is fed back, and a film thickness measurement recipe is tuned. After the film formation of the next film is terminated in the processing module PM1, as illustrated in FIG. 16C, the film thickness of the next film is measured by the film thickness measuring apparatus 35b while the substrate W on which the next film is formed is carried out from the processing module PM1 by the stage moving mechanism 190. At this time, the optical characteristics of the base film are tuned, and thus, high film thickness measurement accuracy may be obtained.

Further, similar to the film thickness measuring apparatus 35' in FIG. 11, the film thickness measuring apparatus 35b may be provided all of the transfer modules TM1 to TM4, and thus, the film thickness of all of the films may be measured more efficiently. At this time, efficiency may be further promoted by multi-channelizing using a common light source unit as in FIG. 12.

For example, in the embodiment, the film forming system in which the substrate is sequentially and serially transferred to a plurality of processing modules to process is described, but the present disclosure is not limited thereto. The substrate may be randomly transferred to a plurality of processing modules.

Further, the example in which the stacked film used in the MRAM is formed is described as an example of the processing, but the present disclosure is not limited thereto. Further, the elevating mechanism that moves the stage up and down is used to adjust the distance between the light receiving sensor and the film thickness measurement position on the substrate, but the elevating mechanism may move the light emitting/receiving assembly (measurement light emitting/detecting unit) up and down.

According to the present disclosure, the film thickness measuring apparatus and the film thickness measuring method, and the film forming system capable of measuring the film thickness of an extremely thin film on which a film is formed in-situ are provided.

From the foregoing, it will be appreciated that various embodiments of the present disclosure have been described herein for purposes of illustration, and that various Modifications may be made without departing from the scope and spirit of the present disclosure. Accordingly, the various embodiments disclosed herein are not intended to be limiting, with the true scope and spirit being indicated by the following claims.

What is claimed is:

1. A film thickness measuring apparatus comprising:
   a stage configured to place a substrate having a film formed thereon and measure a thickness of the film in-situ in a film forming apparatus, the film forming apparatus including a processing module that forms the film on the substrate and a transfer module that transfers the substrate to the processing module;
   a film thickness meter including a light emitter that emits light toward the substrate disposed on the stage and a light receiving sensor that receives the light reflected by the substrate for measuring the thickness of the film in-situ;
   a moving mechanism including a multi-joint arm configured to move an irradiation point of the light on the substrate;
   a distance meter configured to measure a distance between the light receiving sensor and the irradiation point on the substrate; and
   a distance adjustor configured to adjust the distance between the light receiving sensor and the irradiation point on the substrate.

2. The film thickness measuring apparatus according to claim 1, further comprising:
   a reference plate provided on the stage, made of a same material as a base of the substrate, and serving as a reference for a light source.

3. The film thickness measuring apparatus according to claim 1, wherein the film thickness meter irradiates a broad light having a wavelength of 800 nm or less.

4. The film thickness measuring apparatus according to claim 1, wherein the distance meter is a laser distance meter.

5. The film thickness measuring apparatus according to claim 4, wherein the laser distance meter includes a laser emitter that emits a laser light for measuring the distance toward the stage and a receiving sensor that receives the laser light reflected by the substrate, and
   the film thickness meter and the laser distance meter are integrally provided to be adjacent to each other.

6. The film thickness measuring apparatus according to claim 1, wherein the moving mechanism includes a first mover configured to move the film thickness meter in a radial direction of the substrate, and a second mover configured to rotate the stage.

7. The film thickness measuring apparatus according to claim 1, wherein the moving mechanism includes a first mover configured to move the stage in a radial direction of the substrate, and a second mover configured to rotate the stage.

8. The film thickness measuring apparatus according to claim 7, wherein the first mover includes a first sub-mover configured to move a member that supports the stage along a rail provided horizontally.

9. The film thickness measuring apparatus according to claim 1, wherein the moving mechanism includes a stage mover configured to arbitrarily move the stage in a horizontal plane.

10. The film thickness measuring apparatus according to claim 1, wherein the film thickness of the film formed on the substrate is 10 nm or less.

11. A film thickness measuring method comprising:
providing a film thickness measuring apparatus including:
a stage configured to place a substrate having a film formed thereon and measure a thickness of the film in-situ in a film forming apparatus, the film forming apparatus including a processing module that forms the film on the substrate and a transfer module that transfers the substrate to the processing module;
a film thickness meter including a light emitter that emits light toward the substrate disposed on the stage and a light receiving sensor that receives the light reflected by the substrate for measuring the thickness of the film in-situ;
a moving mechanism including a multi-joint arm configured to move an irradiation point of the light on the substrate;
a distance meter configured to measure a distance between the light receiving sensor and the irradiation point on the substrate; and
a distance adjustor configured to adjust the distance between the light receiving sensor and the irradiation point on the substrate,
measuring a distance between the light receiving sensor and a film thickness measurement position on the substrate where a film thickness is to be measured by irradiating light from the distance meter;
adjusting a distance between the light receiving sensor at the film thickness measurement position and the irradiation point on the substrate after moving the film thickness meter to the film thickness measurement position, based on a distance measured in the measuring the distance; and
measuring a film thickness by irradiating the film thickness measurement position with light from the light emitter and detecting a reflected light by the light receiving sensor.

12. The film thickness measuring method according to claim 11, wherein the film thickness measuring apparatus further includes a reference plate provided on the stage, the reference plate being made of a same material as a base of the substrate and serving as a reference for a light source, and
the film thickness measuring method further comprises:
measuring a reference by irradiating the reference plate with light from the light emitter, before measuring the distance.

13. The film thickness measuring method according to claim 11, wherein the measuring the film thickness is performed by irradiating a broad light having a wavelength of 800 nm or less from the film thickness meter.

14. The film thickness measuring method according to claim 11, wherein the distance meter is a laser distance meter, and the measuring the distance is performed by irradiating the film thickness measurement position of the substrate with a laser light from the laser distance meter.

15. The film thickness measuring method according to claim 14, wherein the laser distance meter includes a laser emitter that emits a laser light for measuring the distance toward the stage and a light receiving sensor that receives the laser light reflected from the substrate, and
the film thickness meter and the laser distance meter are integrally provided to be adjacent to each other.

16. The film thickness measuring method according to claim 11, wherein the moving mechanism includes a first mover configured to move the film thickness meter in a radial direction of the substrate, and a second mover configured to rotate the stage.

17. The film thickness measuring method according to claim 11, wherein the moving mechanism includes a first mover configured to move the stage in a radial direction of the substrate, and a second mover configured to rotate the stage.

18. The film thickness measuring method according to claim 17, wherein the first mover includes a first sub-mover configured to move a member that supports the stage along a rail provided horizontally.

19. The film thickness measuring method according to claim 11, wherein the moving mechanism includes a stage mover configured to arbitrarily move the stage in a horizontal plane.

20. The film thickness measuring method according to claim 11, wherein the film thickness of the film formed on the substrate is 10 nm or less.

21. A film forming system comprising:
a processing module configured to form a film on a substrate;
a transfer module configured to transfer a substrate to the processing module; and
a film thickness measuring apparatus configured to measure a film thickness of the film formed by the processing module in-situ,
wherein the film thickness measuring apparatus includes:
a stage configured to place a substrate having a film formed thereon and measure a thickness of the film in-situ in a film forming apparatus, the film forming apparatus including a processing module that forms the film on the substrate and a transfer module that transfers the substrate to the processing module;
a film thickness meter including a light emitter that emits light toward the substrate disposed on the stage and a light receiving sensor that receives the light reflected by the substrate for measuring the thickness of the film in-situ;
a moving mechanism including a multi-joint arm configured to move an irradiation point of the light on the substrate;
a distance meter configured to measure a distance between the light receiving sensor and the irradiation point on the substrate; and
a distance adjustor configured to adjust the distance between the light receiving sensor and the irradiation point on the substrate.

22. The film forming system according to claim 21, wherein the film thickness measuring apparatus further includes a chamber connected to the transfer module and configured to accommodate the stage therein.

23. The film forming system according to claim 21, wherein the film thickness measuring apparatus is provided in the transfer module.

24. The film forming system according to claim 21, wherein a plurality of transfer modules to which the processing module is connected is provided, and the plurality of transfer modules are connected to each other, and the film thickness measuring apparatus is provided at a connecting portion of the transfer modules.

25. The film forming system according to claim 21, wherein the film thickness measuring apparatus is provided inside the processing module.

26. The film forming system according to claim 21, wherein a plurality of film thickness measuring apparatuses is provided, and light branched from a common light source is supplied to the film thickness meter in each of the plurality of film thickness measuring apparatuses.

27. A film forming system comprising:
  a plurality of processing modules each configured to form a film on a substrate;
  a transfer module configured to transfer a substrate to each of the plurality of processing modules;
  a film thickness measuring apparatus configured to measure a film thickness of the film formed by the plurality of processing modules in-situ; and
  a controller,
  wherein the film thickness measuring apparatus includes:
    a stage configured to place a substrate having a film formed thereon and measure a thickness of the film in-situ in a film forming apparatus, the film forming apparatus including a processing module that forms the film on the substrate and a transfer module that transfers the substrate to the processing module;
    a film thickness meter including a light emitter that emits light toward the substrate disposed on the stage and a light receiving sensor that receives the light reflected by the substrate for measuring the thickness of the film in-situ;
    a moving mechanism including a multi-joint arm configured to move an irradiation point of the light on the substrate;
    a distance meter configured to measure a distance between the light receiving sensor and the irradiation point on the substrate; and
    a distance adjustor configured to adjust the distance between the light receiving sensor and the irradiation point on the substrate,
  wherein, after a first film is formed on the substrate by a processing module, the controller causes the film thickness measuring apparatus to measure a film thickness of the first film thereby tuning a film thickness measurement recipe based on a result of the film thickness measurement, and causes another processing module to form a second film on the substrate on which the first film is formed and causes the film thickness measuring apparatus to measure a film thickness of the second film using the tuned film thickness measurement recipe.

28. A film forming method comprising:
providing a film thickness measuring system including:
  a processing module configured to form a film on a substrate;
  a transfer module configured to transfer a substrate to the processing module; and
  a film thickness measuring apparatus configured to measure a film thickness of the film formed by the processing module in-situ,
  wherein the film thickness measuring apparatus includes:
    a stage configured to place a substrate having a film formed thereon and measure a thickness of the film in-situ in a film forming apparatus, the film forming apparatus including a processing module that forms the film on the substrate and a transfer module that transfers the substrate to the processing module;
    a film thickness meter including a light emitter that emits light toward the substrate disposed on the stage and a light receiving sensor that receives the light reflected by the substrate for measuring the thickness of the film in-situ;
    a moving mechanism including a multi-joint arm configured to move an irradiation point of the light on the substrate;
    a distance meter configured to measure a distance between the light receiving sensor and the irradiation point on the substrate; and
    a distance adjustor configured to adjust the distance between the light receiving sensor and the irradiation point on the substrate,
forming a first film on the substrate by a processing module;
measuring a film thickness of the first film by the film thickness measuring apparatus;
tuning a film thickness measurement recipe based on the film thickness measured in the measuring;
forming a second film on the substrate on which the first film is formed by another processing module; and
measuring a film thickness of the second film by the film thickness measuring apparatus using the film thickness measurement recipe tuned in the tuning.

* * * * *